(12) United States Patent
Pattabiraman et al.

(10) Patent No.: US 9,411,674 B2
(45) Date of Patent: Aug. 9, 2016

(54) PROVIDING HARDWARE RESOURCES HAVING DIFFERENT RELIABILITIES FOR USE BY AN APPLICATION

(75) Inventors: Karthik Pattabiraman, Vancouver (CA); Thomas Moscibroda, Redmond, WA (US); Benjamin G. Zorn, Woodinville, WA (US); Song Liu, Evanston, IL (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1816 days.

(21) Appl. No.: 12/727,305

(22) Filed: Mar. 19, 2010

(65) Prior Publication Data

US 2011/0231601 A1    Sep. 22, 2011

(51) Int. Cl.
| | |
|---|---|
| *G06F 12/02* | (2006.01) |
| *G06F 11/07* | (2006.01) |
| *G11C 11/406* | (2006.01) |
| *G06F 1/32* | (2006.01) |
| *G06F 9/50* | (2006.01) |

(52) U.S. Cl.
CPC .......... *G06F 11/0793* (2013.01); *G06F 1/3203* (2013.01); *G06F 1/3275* (2013.01); *G06F 11/073* (2013.01); *G06F 12/0223* (2013.01); *G11C 11/406* (2013.01); *G06F 9/5016* (2013.01); *G06F 2212/1028* (2013.01); *Y02B 60/1228* (2013.01)

(58) Field of Classification Search
CPC ............ Y02B 60/1225; Y02B 60/1228; G06F 11/0793; G06F 11/073; G06F 1/3203; G06F 12/02; G06F 12/0223; G06F 9/5016; G06F 2212/1028; G11C 11/406
See application file for complete search history.

(56) References Cited

U.S. PATENT DOCUMENTS

| | | |
|---|---|---|
| 6,094,705 A | 7/2000 | Song |
| 6,542,958 B1 | 4/2003 | Song |
| 6,633,951 B2 | 10/2003 | Cohen |

(Continued)

OTHER PUBLICATIONS

Harizopoulos, et al., "Energy Efficiency: The New Holy Grail of Data Management Systems Research," retrieved at <<http://www.hpl.hp.com/personal/Mehul_Shah/papers/cidr_2009_hariz.pdf>>, The 4th Biennial Conference on Innovative Data Systems Research (CIDR), Jan. 4-7, 2009, 8 pages.

(Continued)

*Primary Examiner* — Matthew Bradley
*Assistant Examiner* — Rocio Del Mar Perez-Velez
(74) *Attorney, Agent, or Firm* — Alin Corie; Sandy Swain; Micky Minhas

(57) ABSTRACT

Power management functionality is described for implementing an application in an energy-efficient manner, without substantially degrading overall performance of the application. The functionality operates by identifying at least first data and second data associated with the application. The first data is considered to have a greater potential impact on performance of the application compared to the second data. The functionality then instructs a first set of hardware-level resources to handle the first data and a second set of hardware-level resources to handle the second data. The first set of hardware-level resources has a higher reliability compared to the second set of hardware-level resources. In one case, the first and second hardware-level resources comprise DRAM memory units. Here, the first set of hardware-level resources achieves greater reliability than the second set of hardware-level resources by being refreshed at a higher rate than the second set of hardware-level resources.

19 Claims, 8 Drawing Sheets

(56) References Cited

U.S. PATENT DOCUMENTS

| | | | |
|---|---|---|---|
| 7,362,643 B2 | 4/2008 | Okada | |
| 7,496,777 B2 | 2/2009 | Kapil | |
| 7,564,731 B2 | 7/2009 | Gilton | |
| 7,590,021 B2 | 9/2009 | Michalak et al. | |
| 2003/0206427 A1 | 11/2003 | Hwang et al. | |
| 2007/0180187 A1 | 8/2007 | Olson et al. | |
| 2008/0077603 A1* | 3/2008 | Arnott et al. | 707/101 |
| 2008/0092016 A1* | 4/2008 | Pawlowski | G06F 11/1044 714/764 |
| 2008/0140957 A1 | 6/2008 | Pattabiraman et al. | |
| 2008/0140962 A1* | 6/2008 | Pattabiraman | G06F 11/183 711/162 |
| 2008/0291765 A1* | 11/2008 | Smith | 365/222 |
| 2009/0161459 A1 | 6/2009 | Kohler et al. | |

OTHER PUBLICATIONS

Austin, et al., "Opportunities and Challenges for Better than Worst-Case Design," retrieved at <<http://www.eecs.umich.edu/~taustin/papers/ASPDAC05-btwc.pdf>>, Proceedings of the 2005 Asia and South Pacific Design Automation Conference, 2005, 6 pages.

Baek, et al., "Green: A System for Supporting Energy-Conscious Programming using Principled Approximation," retrieved at <<http://research.microsoft.com/pubs/101217/Green_paper.pdf>>, Microsoft Technical Report No. MSR-TR-2009-89, Microsoft Corporation, Redmond, WA, 14 pages.

Bhalodia, Vimal, "Scale DRAM Subsystem Power Analysis," retrieved at <<http://groups.csail.mit.edu/cag/scale/ papers/vimb-meng.pdf>>, Massachusetts Institute of Technology, 2005, 51 pages.

Chen, et al., "Surviving Sensor-Networks Software Faults," retrieved at <<http://www.sigops.org/sosp/sosp09/papers/chen-sosp09.pdf>>, Proceedings of the ACM SIGOPS 22nd symposium on Operating Systems Principles, 2009, 16 pages.

Ernst, et al., "Razor: A Low-Power Pipeline Based on Circuit-Level Timing Speculation," retrieved at <<http://ieeexplore.ieee.org/stamp/stamp.jsp?tp=&arnumber=1253179&isnumber=28039>>, Proceedings of the 36th International Symposium on Microarchitecture, 2003, 12 pages.

Ellis, et al., "System Support for Energy Management in Mobile and Embedded Workloads: A White Paper," retrieved at <<http://citeseerx.ist.psu.edu/viewdoc/download?doi=10.1.1.41.7294&rep=rep1&type=pdf>>, Duke University, Technical Report, Oct. 1999, 15 pages.

Fierz, M., "4 in a Row," retrieved at <<http://www.fierz.ch/4inarow.htm>>, Aug. 7, 2008, 4 pages.

Flinn, et al., "Power and Energy Characterization of the Itsy Pocket Computer (Version 1.5)," retrieved at <<http://www.hpl.hp.com/techreports/Compaq-DEC/WRL-TN-56.pdf>>, Compaq, Western Research Laboratory, Technical Note TN-56, 2000, 47 pages.

Ghosh, et al., "Smart Refresh: An Enhanced Memory Controller Design for Reducing Energy in Conventional and 3D Die-Stacked DRAMs," retrieved at <<http://arch.ece.gatech.edu/pub/micro40.pdf>>, Proceedings of the 40th Annual IEEE/ACM International Symposium on Microarchitecture, 2007, 12 pages.

"Dynamic Random Access Memory," retrieved at <<http://en.wikipedia.org/wiki/Dynamic_random_access_memory>>, Wikipedia entry, retrieved on Jan. 24, 2010, 13 pages.

Isen, et al., "ESKIMO—Energy Savings Using Semantic Knowledge of Inconsequential Memory Occupancy for DRAM Subsystem," retrieved at <<http://lca.ece.utexas.edu/pubs/isen_micro09.pdf>>, Proceedings of the 42nd Annual IEEE/ACM International Symposium on Microarchitecture, 2009, 10 pages.

Karlson, et al., "Working Overtime: Patterns of Smartphone and PC Usage in the Day of an Information Worker," retrieved at <<http://students.washington.edu/skane/pubs/pervasive09.pdf>>, Proceedings of the 7th International Conference on Pervasive Computing, 2009, 8 pages.

Katayama, et al., "Fault-Tolerant Refresh Power Reduction of DRAMs for Quasi-Nonvolatile Data Retention," retrieved at <<http://ieeexplore.ieee.org/stamp/stamp.jsp?tp=&arnumber=802898&isnumber=17398>>, Proceedings of the 14th International Symposium on Defect and Fault-Tolerance in VLSI Systems, 1999, 8 pages.

Kim, et al., "Block-Based Multiperiod Dynamic Memory Design for Low Data-Retention Power," retrieved at http://ieeexplore.ieee.org/stamp/stamp.jsp?arnumber=01255476>>, IEEE Transactions on Very Large Scale Integration (VLSI) Systems, vol. 11, No. 6, Dec. 2003, pp. 1006-1018.

Kolb, C., "Rayshade Graphics Program," retrieved at <<http://www-graphics.stanford.edu/~cek/rayshade/rayshade.html>>, Oct. 22, 2009, 2 pages.

Lee, et al., "Architecting Phase Change Memory as a Scalable Dram Alternative", retrieved at <<ftp://ftp.cs.utexas.edu/pub/dburger/papers/ISCA09.pdf>>, Proceedings of the 36th Annual International Symposium on Computer Architecture, Jun. 20-24, 2009, 12 pages.

Lee, et al., "Media-Bench: A Tool for Evaluating and Synthesizing Multimedia and Communications Systems," retrieved at <<http://ieeexplore.ieee.org/stamp/stamp.jsp?tp=&arnumber=645830&isnumber=14079>>, Proceedings of the 30th Annual ACM/IEEE International Symposium on Microarchitecture, 1997, pp. 330-335.

Lefurgy, et al., "Energy Management for Commercial Servers", Retrieved at <<http://www.research.ibm.com/people/l/lefurgy/Publications/computer2003.pdf>>, Computer, vol. 36, No. 12, Dec. 2003, pp. 39-48.

Li, et al., "Application-Level Correctness and its Impact on Fault Tolerance," retrieved at <<http://ieeexplore.ieee.org/stamp/stamp.jsp?tp=&arnumber=4147659&isnumber=4147636>>, Proceedings of the 2007 IEEE 13th International Symposium on High Performance Computer Architecture, 2007, pp. 181-192.

Luk, et al., "Pin: Building Customized Program Analysis Tools with Dynamic Instrumentation," retrieved at <<http://www.csl.cornell.edu/~sam/ece699/pin-pldi05.pdf>>, Proceedings of the 2005 ACM SIGPLAN Conference on Programming Language Design and Implementation, 2005, 11 pages.

Mallik, et al., "A Case for Clumsy Packet Processors," retrieved at <<http://ieeexplore.ieee.org/stamp/stamp.jsp?tp=&arnumber=1550990&isnumber=33048>>, Proceedings of the 37th Annual IEEE/ACM International Symposium on Microarchitecture, 2004, 10 pages.

"1Gb Mobile LPDDR: MT46H32M32LFCG-5 IT," retrieved at <<http://www.micron.com/products/partdetail?part=MT46H32M32LFCG-5%20IT>>, Micron Technology, Boise, Idaho, retrieved on Feb. 3, 2010, 2 pages.

"System Power Calculator," retrieved at <<http://www.micron.com/support/designsupport/tools/powercalc/powercalc>>, Micron Technology, Boise, Idaho, retrieved on Feb. 3, 2010, 1 page.

Liu et al., "Flicker: Saving Refresh-Power in Mobile Devices through Critical Data Partitioning," retrieved at <<http://research.microsoft.com/apps/pubs/default.aspx?id=102932>>, Microsoft Technical Report No. MSR-TR-2009-138, Microsoft Corporation, Redmond, WA, 18 pages.

Patel, et al., "Energy-Efficient Value Based Selective Refresh for Embedded DRAMs," retrieved at <<http://www.springerlink.com/content/6vtpdu4fxtwb4f7g/>>, Lecture Notes in Computer Science, vol. 3728, 2005, pp. 466-476.

Pattabiraman, et al., "Samurai: Protecting Critical Data in Unsafe Languages", retrieved at <<http://research.microsoft.com/pubs/70341/tr-2006-127.pdf>>, Microsoft Technical Report No. MSR-TR-2006-127, Microsoft Corporation, Redmond, WA, 2007, 18 pages.

Hoffmann, et al., "Using Code Perforation to Improve Performance, Reduce Energy Consumption, and Respond to Failures," retrieved at <<http://dspace.mit.edu/bitstream/handle/1721.1/46709/MIT-CSAIL-TR-2009-042.pdf?sequence=1>>, Massachusetts Institute of Technology, Technical Report No. MIT-CSAIL-TR-2009-042, Sep. 3, 2009, 21 pages.

Rinard, Martin, "Probabilistic Accuracy Bounds for Fault-Tolerant Computations that Discard Tasks," retrieved at <<http://people.csail.mit.edu/rinard/paper/ics06.pdf>>, Proceedings of the 20th Annual International Conference on Supercomputing, 2006, 11 pages.

Sartori, et al., "Fluid NMR—Performing Power/Reliability Tradeoffs for Applications with Error Tolerance," retrieved at

(56) References Cited

OTHER PUBLICATIONS

<<http://passat.crhc.illinois.edu/rakeshk/hotpower09_cam.pdf>>, Workshop on Power Aware Computing and Systems, 2009, 5 pages.

Sorber, et al., "Eon: a Language and Runtime System for Perpetual Systems," draft version retrieved at <<http://www.cs.utexas.edu/users/speedway/DaCapo/papers/eon.pdf>>, Proceedings of the 5th International Conference on Embedded Networked Sensor Systems, 2007, 14 pages.

"SPEC CPU2000," retrieved at <<http://www.spec.org/cpu2000/>>, Standard Performance Evaluation Corporation, retrieved on Feb. 3, 2010, 3 pages.

Venkatesan, et al., "Retention-Aware Placement in DRAM (Rapid): Software Methods for Quasi-Nonvolatile DRAM," retrieved at <<http://ieeexplore.ieee.org//stamp/stamp.jsp?tp=8,arnumber=01598122>>, Proceedings of the Twelfth Annual Symposium on High Performance Computer Architecture, 2006, pp. 157-167.

Weiser, et al., "Scheduling for Reduced CPU Energy," retrieved at <<http://www.ece.umd.edu/class/enee759m.S2002/papers/weiser1994-osdi1.pdf>>, Kluwer International Series in Engineering and Computer Science, 1996, 11 pages.

Shafik, et al., "Soft Error Voltage Scaling Technique for Power Minimization in Application-Specific Multiprocessor System-on-Chip, Resilience of Probabilistic Inference Applications," retrieved at <<http://eprints.ecs.soton.ac.uk/17319/1/05Jolpe02-1016.pdf>>, Journal of Low Power Electronics, vol. 5, No. 2, 2009, 12 pages.

Yuan, et al., "GRACE-1: Cross-Layer Adaptation for Multimedia Quality and Battery Energy," retrieved at <<http://ieeexplore.ieee.org/stamp/stamp.jsp?tp=&arnumber=1637430&isnumber=34315>>, IEEE Transactions on Mobile Computing, vol. 5, No. 7, Jul. 2006, pp. 799-815.

Wong, et al., "Soft Error Resilience of Probabilistic Inference Applications," retrieved at <<http://selse2.selse.org/papers/wong.pdf>>, Proceedings of the Workshop on System Effects of Logic Soft Errors, 2006, 4 pages.

Ngmoco, "Star Defense." [Online]. Available: http://web.archive.org/web/20090806084519/http://stardefense.ngmoco.com/. 1 Page Aug. 6, 2009.

* cited by examiner

PROVIDING HARDWARE RESOURCES HAVING DIFFERENT RELIABILITIES FOR USE BY AN APPLICATION

BACKGROUND

Many technologies place considerable emphasis on the effective management of energy consumption. For example, portable devices (such as mobile telephones and the like) use batteries that deliver a limited amount of power. These devices can benefit from energy management by reducing the frequency at which the devices require recharging. By contrast, data centers have an uninterrupted supply of power, but typically consume a large amount of power. These environments can benefit from energy management by reducing the costs associated with energy consumption.

To address these needs, the industry has developed numerous techniques to control the consumption of power. One type of technique operates by selectively shutting features of a system down. For example, the Partial Array Self Refresh (PASR) technique operates by refreshing only a portion of DRAM memory in a sleep mode of a device. The remaining portion of memory is unusable in this state. This approach is not fully satisfactory because it limits the functionality of the system while in a powered-down mode. Still other approaches have been proposed having associated shortcomings.

SUMMARY

Power management functionality (PMF) is described for implementing an application in an energy-efficient manner, without substantially degrading overall performance of the application. The PMF operates by identifying at least first data and second data associated with the application. Corruption of the first data has a first impact on performance of the application, and corruption of the second data has a second impact on performance of the application. The first impact is assessed as less preferable than the second impact based on at least one assessment factor. The PMF then instructs a first set of hardware-level resources to handle the first data and a second set of hardware-level resources to handle the second data. The first set of hardware-level resources has a higher reliability compared to the second set of hardware-level resources.

As a result of this configuration, the second set of hardware-level resources can be expected to operate at a higher error rate compared to the first set of hardware-level resources. But because the second set of hardware-level resources is operating on less critical data compared to the first set of hardware-level resources, the errors generated thereby do not substantially degrade the overall performance of the application, as assessed based on the above-referenced at least one assessment factor.

The PMF can achieve one or more performance objectives. One performance objective is the conservation of energy. This objective can be achieved because the second set of hardware-level resources consumes less energy than the first set of hardware-level resources. This reduces the net expenditure of energy in a device or system that uses the PMF.

The PMF is considered both application-centric and data-centric. This is because the PMF can selectively configure its hardware-level resources in a manner that is based on the assessed criticality of individual data items which appear in individual applications.

In one illustrative case, the first and second hardware-level resources comprise DRAM memory units. Here, the first set of hardware-level resources achieves greater reliability than the second set of hardware-level resources by being refreshed at a higher rate than the second set of hardware-level resources. The PMF can configure these memory units to operate at these different respective refresh rates.

According to another illustrative aspect, a user can annotate application code associated with the application to designate data items that are considered non-critical. The above-mentioned identifying operation can involve, in part, interpreting the express designations within the application code. In the above-described memory-related implementation, the designated data is then stored in the second set of hardware-level resources.

According to another illustrative aspect, the PMF can be implemented by various mechanisms in a hierarchy of programming resources which implement an application. The programming resources that may play a part include a runtime system, an operating system, and a hardware system.

According to one illustrative case, the PMF can be implemented by a mobile device. According to another illustrative case, the PMF can be implemented by functionality (e.g., a server) in a data center, and so on.

According to one illustrative case, the PMF can be invoked when the system being controlled is about to enter a low-power mode of operation.

The above approach can be manifested in various types of systems, components, methods, computer readable media, data structures, articles of manufacture, and so on.

This Summary is provided to introduce a selection of concepts in a simplified form; these concepts are further described below in the Detailed Description. This Summary is not intended to identify key features or essential features of the claimed subject matter, nor is it intended to be used to limit the scope of the claimed subject matter.

The same numbers are used throughout the disclosure and figures to reference like components and features. Series 100 numbers refer to features originally found in FIG. 1, series 200 numbers refer to features originally found in FIG. 2, series 300 numbers refer to features originally found in FIG. 3, and so on.

DETAILED DESCRIPTION

This disclosure is organized as follows. Section A describes illustrative power management functionality for implementing an application in an energy-efficient manner. Section B describes illustrative methods which explain the operation of the power management functionality of Section A. Section C describes illustrative computing functionality that can be used to implement any aspect of the features described in Sections A and B.

Figure 10:
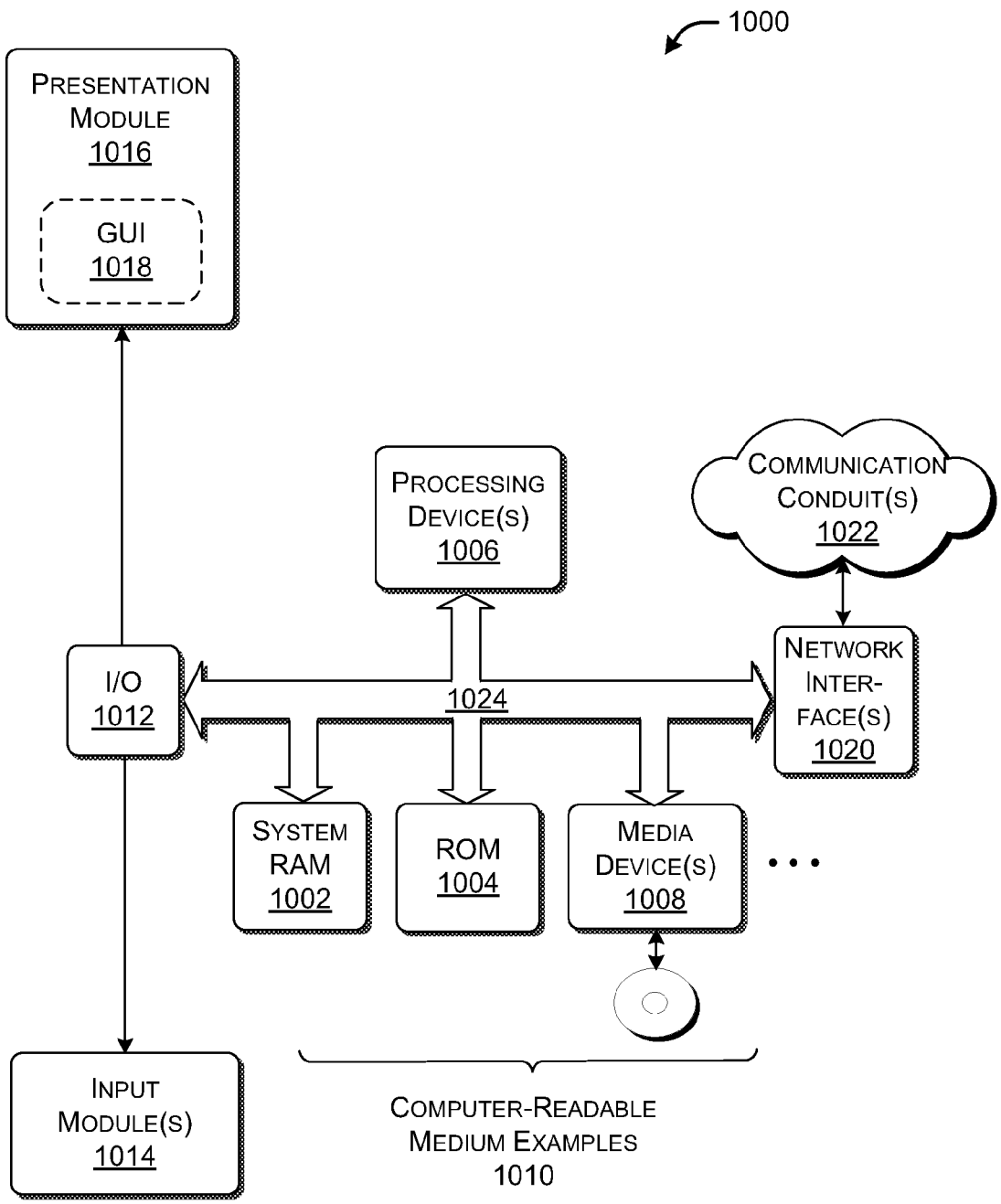
FIG. 10 shows illustrative computing functionality that can be used to implement any aspect of the features shown in the foregoing drawings.

As a preliminary matter, some of the figures describe concepts in the context of one or more structural components, variously referred to as functionality, modules, features, elements, etc. The various components shown in the figures can be implemented in any manner. In one case, the illustrated separation of various components in the figures into distinct units may reflect the use of corresponding distinct components in an actual implementation. Alternatively, or in addition, any single component illustrated in the figures may be implemented by plural actual components. Alternatively, or in addition, the depiction of any two or more separate components in the figures may reflect different functions performed by a single actual component. FIG. 10, to be discussed in turn, provides additional details regarding one illustrative implementation of the functions shown in the figures.

Other figures describe the concepts in flowchart form. In this form, certain operations are described as constituting distinct blocks performed in a certain order. Such implementations are illustrative and non-limiting. Certain blocks described herein can be grouped together and performed in a single operation, certain blocks can be broken apart into plural component blocks, and certain blocks can be performed in an order that differs from that which is illustrated herein (including a parallel manner of performing the blocks). The blocks shown in the flowcharts can be implemented in any manner.

The following explanation may identify one or more features as "optional." This type of statement is not to be interpreted as an exhaustive indication of features that may be considered optional; that is, other features can be considered as optional, although not expressly identified in the text. Similarly, the explanation may indicate that one or more features can be implemented in the plural (that is, by providing more than one of the features). This statement is not be interpreted as an exhaustive indication of features that can be duplicated. Finally, the terms "exemplary" or "illustrative" refer to one implementation among potentially many implementations.

A. Illustrative Power Management Functionality

A.1. Overview

Figure 1:
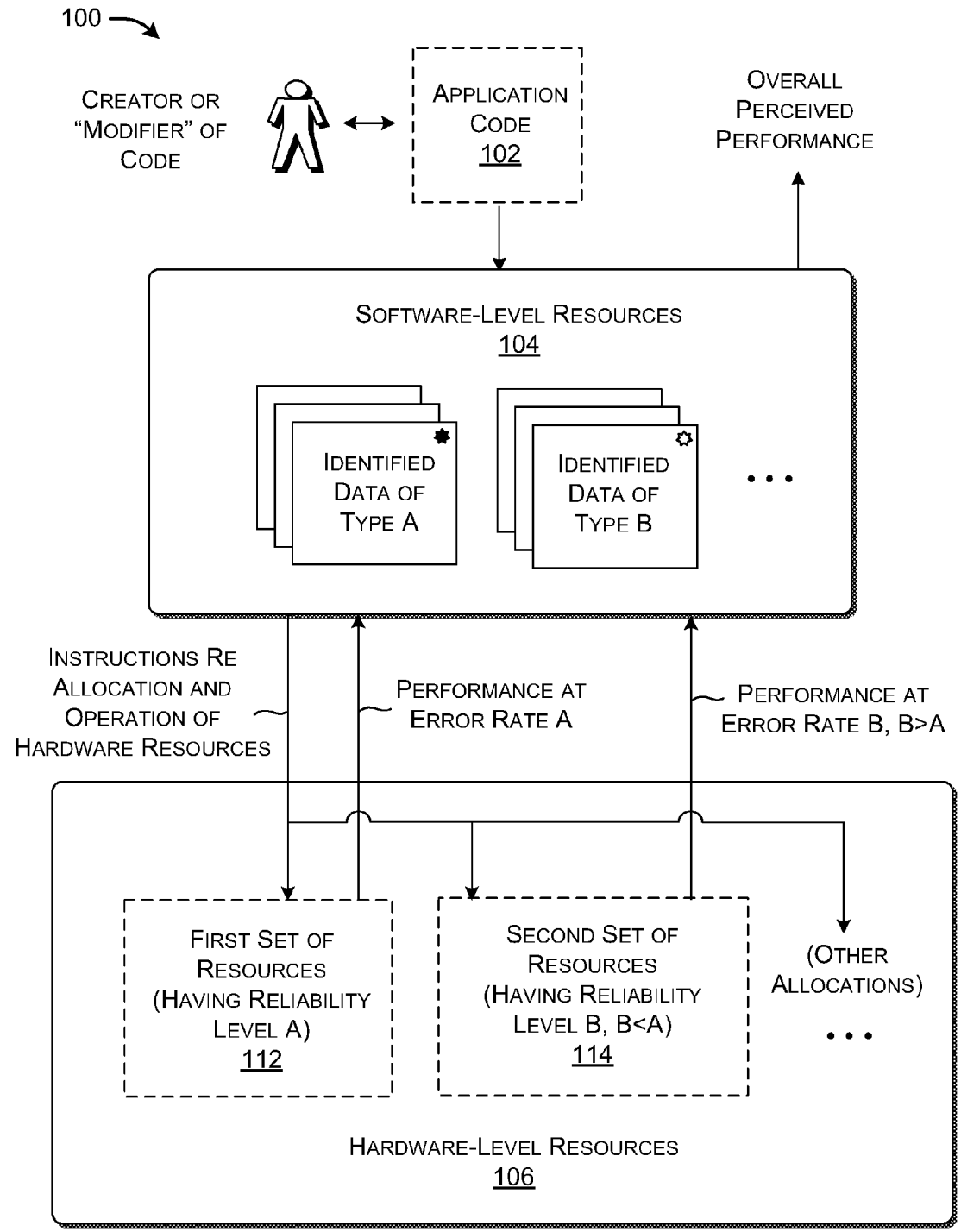
FIG. 1 shows illustrative power management functionality (PMF) for implementing an application in an energy-efficient manner.

FIG. 1 presents an overview of power management functionality (PMF) 100 that implements an application in an energy-efficient manner. The term "application" as used herein refers to any set of instructions for carrying out any function. In one case, the application may correspond to a high-level end-user application. In another case, the application may perform a lower-level function. To cite merely one example, the application may involve the processing and display of video content.

The PMF 100 can be implemented by a combination of features that are distributed over different layers of programming resources which implement the application. A first layer corresponds to application code 102 itself. A second layer is associated with a collection of software-level resources 104 which implement the application code 102 (such as, but not limited to, a run-time system and an operating system, etc.) A third layer corresponds to hardware-level resources 106 which carry out the instructions of the software-level resources 104.

At the application level, a user can create the application code 102 (or modify existing application code) so that it includes designations of at least two types of data. The first type of data is generically referred to herein as type-A data, while the second type of data is referred to as type-B data. The type-A data is data that is assessed as having a greater potential impact on the performance of the application compared to the second data. As used herein, "performance" pertains to any behavior or behaviors of the application during execution, such as, but not limited to, whether the application is executing in a reliable (e.g., correct) manner. For example, consider an application that processes video information. The type-A data may include information used to maintain the order among video frames. The second data may include the video content of the frames themselves. The type-A data is potentially more important/critical than the type-B data because an error in the type-A data can potentially cause a serious problem in the execution of the application. That is, corruption of the type-A data can potentially cause the application to "crash." By contrast, the type-B data may manifest itself in a slight degradation in the quality of the presented video information, which may not even be noticeable to the user. In this example, the data's impact on performance pertains to the data's impact on the reliability of the application during execution.

Different users (or other entities) can define what constitutes "important" or "critical" (type-A) based on any consideration (or combination of considerations) appropriate to an environment, with respect to one or more performance objectives. That is, these designations have no fixed or objective connotations. In one case, as stated above, the user may base his or her assessment on the error-related impact that a corrupted data item may have on the output of the application. In addition, or alternatively, the user may base his or her assessment on whether the application (or other system resources) provides an opportunity to correct a corrupted data item (or, by contrast, whether the data item is considered to be non-recoverable). In addition, or alternatively, the user may consider the extent of power savings that are being sought; for example, the user can incrementally designate data items as non-critical to achieve progressively greater power savings (for reasons to be explained below in detail).

More formally stated, the type-A data can be said to have a first impact on the performance (e.g., reliability) of the application, and the type-B data can be said to have a second impact on the performance of the application. The first impact is assessed as less preferable than the second impact based on at least one assessment factor. In one case, a user (or other entity) ultimately defines the assessment factor(s), either explicitly or implicitly, based on one or more performance objectives being pursued. In other words, the assessment factor(s) serve as criteria that can be used to determine whether a performance objective is being achieved. For example, in the above example, the user is implicitly operating under the assumption that program crashes are less preferable than visual degradation in video quality; hence, the assessment factor in this case corresponds to the ability of the application to continue its services upon encountering an error. The overriding performance objective is the user's desire to reduce the risk of serious dysfunction of an application while conserving power.

To facilitate explanation, the PMF 100 will be explained with reference to two levels of criticality, associated with the type-A data and the type-B data. However, the principles set forth herein can be extended to more than two types of data. For example, the PMF 100 can define three categories of data, corresponding, respectively, to high, medium, and low levels of assessed importance.

A user can classify data items in the application code 102 in different ways. For example, consider the case of expressly named data items in the application code, such as global variables, data structures, arrays, etc. The software-level resources 104 allocate memory for these data items upon loading the application. In this case, the user can provide annotations in the application code 102 that designate type-B data items; the non-designated data items are, by default, considered type-A data items. For example, the user can add the keyword "non-critical" or the like at appropriate junctures in the application code 102 to mark instances of type-B data. Other default designations and assumptions are possible. Alternatively, the user can annotate each data item in the application code 102 as corresponding to type-A data or type-B data, e.g., by annotating the data items using the keywords "critical" or "non-critical" (or the like).

In addition to data items that are expressly identified in the application code 102, the application can include instructions which dynamically allocate memory during the course of running the application. For example, without limitation, the malloc( ) function in the C and C++ languages can be used to dynamically allocate new memory. In this case, the application code 102 can be written to include a first type of malloc( ) function for creating type-A data and a second type of malloc( ) function for creating type-B data. For example, the application code 102 can include a "non-critical malloc( )" function to create memory for the storage of type-B data.

The software-level resources 104 operate on the application code 102 to identify type-A data items and type-B data items. Section A.2 (below) will describe in greater detail how the software-level resources 104 can perform this function. At this point, suffice it to say that the software-level resources 104 can allocate one or more pages of memory for storing type-A data and one or more pages of memory for storing type-B data. In performing this operation, the software-level resources 104 can interpret the express designations added to the application code 102 by the user. In addition, or alternatively, the software-level resources 104 can partition the data associated with the application based on general rules and or other consideration (to be described below).

The software-level resources 104 then send instructions to the hardware-level resources 106. The instructions may convey two pieces of information. First, the software-level resources 104 instruct the hardware-level resources 106 to allocate resources to handle the type-A data and to allocate resources to handle the type-B resources. For example, FIG. 1 shows that the hardware-level resources 106 respond by allocating a first set 112 of hardware-level resources for handling type-A data and a second set 114 of hardware-level resources for handling type-B data. If there are more categories of data, the hardware-level resources 106 may be instructed to allocate additional sets of corresponding hardware-level resources.

Second, the software-level resources 104 may instruct the different sets of hardware-level resources to operate with different respective levels of reliability. For example, in the example more fully described in Section A.2, the first set 112 of hardware-level resources can correspond to a first set of DRAM memory units, and the second set 114 of hardware-level resources can correspond to a second set of DRAM memory units. In this example, the software-level resources 104 can instruct the first set of DRAM memory units to operate at a higher refresh rate compared to the second set of DRAM memory units. This means that the first set of DRAM memory units may produce fewer errors in storing data compared to the second set of DRAM memory units.

In other examples, the hardware-level resources 106 can correspond to processing units, such as cores of a multi-core processing engine. In this example, the software-level resources 104 can instruct different sets of processing cores to operate at lower voltages compared to other sets of processing cores. This again may yield different error rates for different respective sets of hardware-level resources. More generally, no limitation is placed on the type of hardware-level resources that can be operated in different ways to invoke different error-related performances. Further, no limitation is placed on the manner in which the different types of hardware-level resources can be operated to induce different error-related performance.

Alternatively, or in addition, the hardware-level resources 106 can include a first set of components which inherently offers more error-free performance compared to a second set of components. For example, the hardware-level resources 106 can include a first type of memory unit that does not need to be refreshed (such as static memory or the like), and a second type of memory unit that does need to be refreshed (such as DRAM memory or the like). Here, the software-level resources 104 can instruct the hardware-level resources 106 to use the more reliable memory units for storing type-A data and the less reliable memory units for storing the type-B data. In this case, the software-level resources 104 may not need to instruct the memory units to operate in a particular manner, since the memory units may already inherently provide the desired level of performance.

In any case, FIG. 1 shows that the first set 112 of hardware-level resources exhibits a first level of performance and the second set of hardware-level resources exhibits a second level of performance, where the first level of performance is more reliable (e.g., more error-free) than the second level of performance. However, the poorer performance exhibited by the second set 114 of resources is not likely to cause a serious error in the execution of the application. Nor is the poorer performance likely to substantially degrade the overall performance of the application, as viewed from the perspective of the end-user. This is because the second set 114 of resources is particularly entrusted to handle less-critical (type-B) data.

Considered in its entirety, the PMF 100 provides opportunities to conserve power in the execution of the application. This is because the second set 114 resources 114 potentially uses less energy to operate (compared to the first set 112 of resources). For example, assume that the hardware-level resources 106 correspond to DRAM memory units. The second set 114 of hardware-level resources is refreshed at a lower rate than the first set 112 of hardware-level resources; therefore, the second set 114 consumes less power to operate compared to the first set 112. Further, as explained above, the PMF 100 achieves a reduction in energy consumption while not substantially degrading the overall performance of the application.

More formally stated, the second set 114 of hardware-level resources consumes less energy than the first set 112 of hardware-level resources. This has the net effect of reducing energy consumption by the computing functionality while not substantially degrading performance of the application, as assessed based on the above-referenced at least one assessment factor. A user (or some other entity) ultimately defines the assessment factor(s). For instance, in the above example, the user is implicitly operating under the assumption that program crashes are less preferable than visual degradation in video quality; hence, in this case, the assessment factor that is used to assess the overall performance of the application corresponds to the ability of the application to continue its services upon encountering an error.

Conservation of energy is one performance objective. In addition, or alternatively, the PMF 100 can achieve other performance objectives. For example, assume that that a device includes two sets of hardware-level resources, the first set being more reliable than the second set, but the first set being more expensive than the second set. The PMF 100 can be used to allocate type-A data to the first set of resources and type-B data to the second set of resources. This can allow a designer of the device to reduce the amount of the expensive resource, while not otherwise degrading performance to unacceptable levels.

The PMF 100 can be considered both application-centric and data-centric in its selective use of hardware-level resources 106. This is because the PMF 100 dynamically allocates resources having different reliabilities based on the particular data-related characteristics of an individual application. In one extreme case (which may be adopted as the default case), the PMF 100 can conservatively designate all data in an application as type-A data, which will invoke the use of hardware-level resources having normal reliability. This also means that "legacy" applications which do not include custom designations of data will not meet with substandard performance (because all the data referenced therein will be treated as "important" by default).

A.2. Illustrative Implementation

Figure 2:
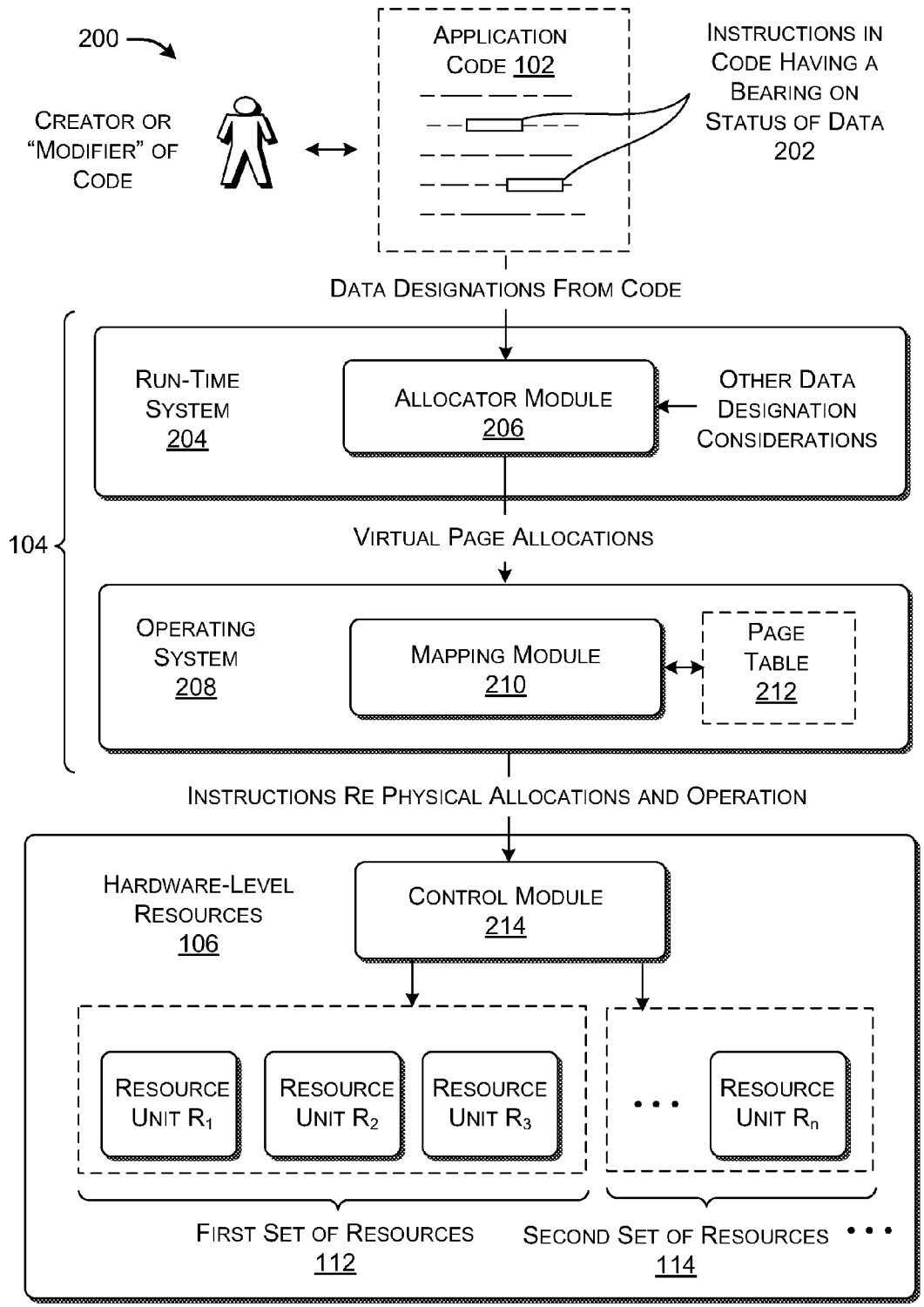
FIG. 2 shows one particular implementation of the PMF of FIG. 1.

FIG. 2 shows one illustrative implementation of the PMF 100 of FIG. 1. Accordingly, this section serves as a vehicle for providing additional illustrative detail regarding the principles set forth in Section A.1. Other environments may implement the principles of Section A.1 in different respective ways.

Beginning with the topmost layer, the PMF 200 of FIG. 2 allows a user to designate type-A data and type-B data in the application code 102 in the manner described above. For example, in one scenario, the user can add annotations 202 that designate data items in the application code 102 as type-B data items; all other data items are considered type-A data items.

The software-level resources 104 that process the application code 102 can include a run-time system 204. As the term is broadly used herein, the run-time system 204 handles the loading and execution of the application. In other words, the run-time system 204 illustrated in FIG. 2 is to be considered as encompassing the functions performed by a loader and system libraries related to memory management and allocation, thread creation and scheduling, disk I/O, etc.

The run-time system 204 includes an allocator module 206. The allocator module 206 identifies instances of type-A data and instances of type-B data. The allocator 206 then allocates the type-A data to one or more pages of memory and allocates the type-B data to one or more pages of memory. In other words, in one implementation, the allocator module 206 allocates data to pages such that there is no mixing of different types of data; that is, in one case, the allocator module 206 does not create a page which contains both type-A data and type-B data. Here, the pages of memory correspond to memory within a virtual address space (not physical address space).

In one example, the allocator module 206 can designate a page of type-A data using a telltale bit (or other code). The allocator module 206 can assert this bit as a default. If the user has designated a particular data item as type-B data, then the allocator module 206 can un-toggle the bit. Still other approaches can be used to discriminate pages of type-A data from pages of type-B data.

The allocator module 206 can discriminate the type-A data from the type-B data based on various considerations. One consideration is the express designations of the user, as captured by the annotations 202 in the application code 102. In addition, or alternatively, the allocator module 206 can apply general rules to discriminate type-A data from type-B data. For example, the allocator module 206 can be configured to designate certain types of data items as either type-A or type-B data without requiring the user to expressly tag these data items as such. In one case, these rules can be expressed in an IF-THEN format; namely, such a rule can specify that IF circumstance X is present in the application code 102 being executed, THEN an associated data item is interpreted as a type-B data item, etc.

Figure 3:
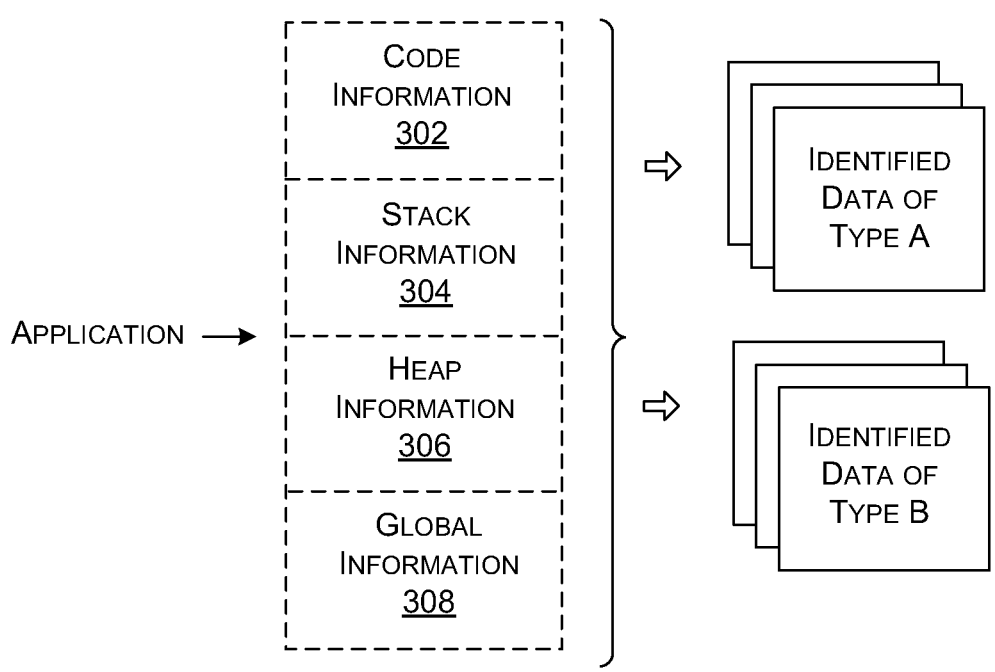
FIG. 3 is a graphical illustration that indicates how application-related information can be allocated to different respective pages.

More generally, FIG. 3 shows that an application has different fields of application-related information that are stored in memory. A first field corresponds to code information 302. This field corresponds to the instructional content of the application code 102 itself. A second field corresponds to stack information 304. This field corresponds to information used on a temporary basis, e.g., in connection with the execution of program call instructions and the like. A third field corresponds to heap information 306. This field correspond to information stored in memory that is dynamically allocated in the course of executing the application, e.g., in response to execution of a malloc( ) function or the like. A fourth field corresponds to global information 308. This field corresponds to memory that is created upon initial loading of the application, e.g., based on expressly-specified data items in the application code 102.

In this context, the allocator module 206 can partition the heap information 306 and the global information 308 into pages of type-A data and pages of type-B data based on express designations added to the application code 102 and/or general rules. For example, as explained above, the user can designate a variable as a type-B data item using an appropriate annotation added to the application code 102. Further, the user can use a malloc( ) function to create memory for storing type-B data, etc. In contrast, the allocator module 206 may, as a default, designate all the code information 302 and the stack information 304 as type-A data; this is because a corruption of this data may cause a serious problem in the execution of the program. But in other cases, the allocator module 206 can separate type-A code data from type-B code data, and/or type-A stack data from type-B stack data. This again can be based on express designations added to the application code 102 and/or general rules.

Alternatively, or in addition, the allocator module 206 can discriminate between type-A data and type-B data based on dynamic considerations. For example, assume that an attempt is first made to execute the application with a certain data item designated as a type-B data item (corresponding to non-critical data). Assume that this designation leads to a serious error (or other undesirable outcome) in the execution of the program. In this case, the allocator module 206 can re-designate the data item as a type-A data item.

The allocator module 206 can also take into consideration the preferences of different users. For example, a first user may not mind a slight degradation in an application, and therefore may permit certain data items to be classified as type-B data items. A second user may object to this classification, whereupon the allocator module 206 can classify the data items as type-A data items. Still other considerations can play a role in the classification of data associated with a program.

Ultimately, the allocator module's 206 ability to discriminate between type-A data and type-B data depends on one or more underlying assessment factors. An assessment factor reflects a performance objective being sought in a particular environment. For example, the allocator module 206 can attempt to ensure that the application is able to deliver its basic operability to the user without "crashes" or other significant dysfunctional behavior. Here, the allocator module 206 is governed by an assessment factor that favors continuity of program services. In one case, the assessment factor is implicitly manifested by the annotations added by a user to the application code 102. Alternatively, or in addition, the allocator module 206 can automatically discriminate the type-A data from the type-B data based on general rules, dynamic considerations, etc. In both cases, some user (or other entity) has ultimately defined the type of performance that is deemed preferable in the execution of an application, either implicitly or explicitly.

The software-level resources 104 also include an operating system 208. The operating system 208 serves as an interface between the virtual representation of the application-related information and the physical hardware-level resources 106. The operating system 208 includes a mapping module 210 which maps the virtual pages created by the run-time system 204 into a physical address space used by the hardware-level resources 106. In doing so, the operating system 208 can allocate physical pages of memory for type-A data and physical pages of memory for type-B data. The operating system 208 can discriminate the type of data provided by the run-time system 204 based on the informative bit added to these pages (or based on any other marking protocol). The mapping module 210 performs these mapping operations with the assistance of a page table 212. The entries in the page table 212 correspond to virtual pages in the address space of the application process; these entries are used to map the virtual pages in the process to physical pages in memory.

The operating system 208 communicates instructions to the hardware-level resources 106 in the manner summarized above. First, the operating system 208 instructs the hardware-level resources 106 to allocate the first set 112 of resources to handle the type-A data, and to allocate the second set 114 of resources to handle the type-B data. The operating system 208 then instructs the hardware-level resources 106 to operate in such a manner that the first set 112 of resources offers higher reliability than the second set 114 of resources (providing that these resources do not already inherently function in this manner). In this role, the operating system 208 is essentially acting as a device driver of the hardware-level resources 106.

The hardware-level resources 106 may optionally include a control module 214 that interacts with the operating system 208 and carries out the instructions of the operating system 208. In one case, the operating system 208 provides set-up instructions to the control module 214, after which the control module 214 operates in a substantially autonomous manner. This approach is useful in those circumstances in the operating system 208 conveys its instructions before entering a low-power state; after providing the instructions, the operating system 208 is not required to communicate with the hardware-level resources 106.

As mentioned above, the first set 112 of hardware-level resources can include one or more resource units (e.g., resource units, $R_1$, $R_2$, etc.). The second set 114 of hardware-level resources can likewise include one or more resource units.

Figure 4:
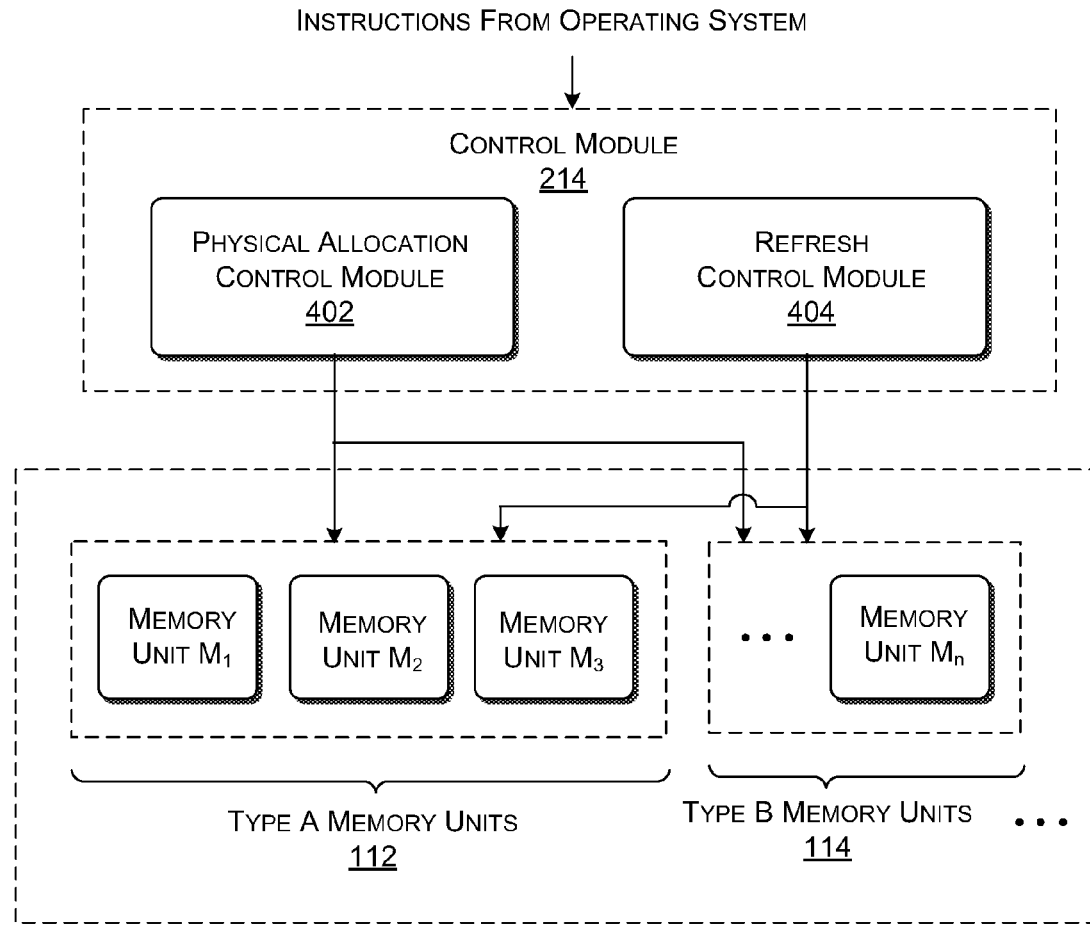
FIG. 4 shows an overview of illustrative hardware-level features of the implementation of FIG. 2.

FIG. 4 shows an example in which the resource units of FIG. 2 correspond to memory units of any type. For example, the first set 112 of resources include one or more memory units (e.g., $M_1$, $M_2$, etc.), and the second set 114 of resources include one or more memory units. The term "memory unit" is intended to have broad connotation as used herein. In one case, two memory units can correspond to two different memory devices, potentially having different characteristics, e.g., a DRAM memory device compared to a static memory device. Alternatively, or in addition, two memory units can correspond to different partitions of a single type of memory device, such as two partitions within a single DRAM memory bank.

As shown in FIG. 4, the control module 214 can include two control components. A physical allocation control module 402 can partition the available memory into two or more sets based on instructions received from the operating system 208. A refresh control module 404 can configure the memory units such that the first set 112 of memory units is refreshed at a higher rate than the second set 114 of memory units. This implementation corresponds to the case in which the available memory can be partitioned and refreshed at different rates. In other cases, different types of memory units having different inherent characteristics are already provided; the task in this case is to allocate different types of data to the appropriate types of memory units.

Figure 5:
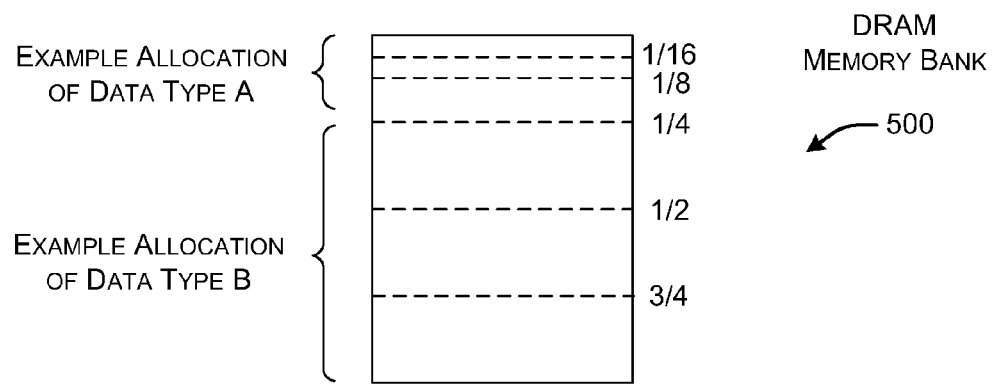
FIG. 5 shows a bank of DRAM memory; more specifically, this figure indicates how DRAM memory can be partitioned into portions having different respective refresh rates.

FIG. 5 shows a single memory bank 500 of DRAM memory. DRAM memory that is provided in a particular implementation may include multiple such memory banks. Without limitation, in one example, the memory bank 500 can be partitioned into fractional sections, e.g., corresponding to ¾, ½, ¼, etc. of an entire amount of memory in the memory bank 500. The physical allocation control module 402 can allocate one or more of these sections to store type-A data and one or more of these sections to store type-B data. The refresh control module 404 can provide instructions that enable the section(s) that store type-A data to be refreshed at a higher rate than the section(s) that store type-B data.

More generally, DRAM memory stores data using individual transistor-implemented capacitors. These storage elements lose charge over time, potentially resulting in "bit flips" errors. In a bit flip, a bit that is stored as a "1" may later be read as a "0," or vice versa. The manufacturer of DRAM memory will typically identify the rate (or rates) at which the DRAM memory can be refreshed to reduce the risk of such bit-flip errors. Hence, the refresh control module 404 can refresh the type-A data at a recommended (normal) rate and refresh the type-B data at a rate that is below the normal rate. Without limitation, in one environment, the refresh control module 404 can refresh the type-A data at a cycle time of 64 or 32 milliseconds, and refresh the type-B data at a cycle time of approximately 1 second. Since the refresh control module 404 purposely underperforms when refreshing the type-B data, the memory that stores the type-B data can be expected to produce more "bit flips" compared to the memory that stores the type-A data.

Note that FIG. 5 represents just one example of how DRAM memory can be selectively partitioned to store different types of data having different respective levels of importance. For example, in another case, the physical allocation control module 402 can devote one or more entire memory banks of DRAM memory for storing type-A data and another one or more entire memory banks for storing type-B data.

Figure 6:
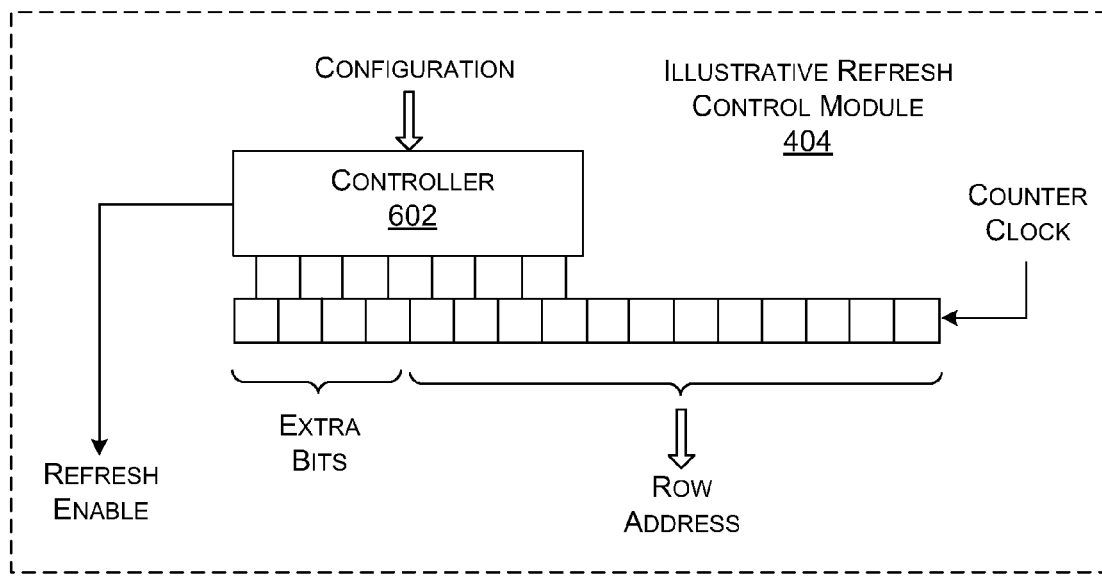
FIG. 6 shows control functionality that can be used to produce different respective refresh rates for application to the DRAM memory of FIG. 5.

FIG. 6 shows one implementation of the refresh control module 404 of FIG. 4. This refresh control module 404 includes a counter that is periodically triggered by a clock, yielding an incrementing or decrementing counter value. An address associated with the counter value may be used to identify a memory location. More specifically, a first portion of the counter value may be used to identify a row address of DRAM memory. A second portion of the counter value may be used to indicate whether or not the identified location is to be refreshed. A controller 602 interprets the second portion of the counter value and, based thereon, issues a refresh enable command for certain memory locations. For example, the controller 602 can be configured to assert the refresh enable bit on a more frequent basis for type-A memory compared to type-B memory. This clocking mechanism is illustrative; other implementations can use other mechanisms to achieve the same effect. In any case, as stated, the refresh control module 404 can operate in an autonomous manner after being configured by instructions received from the operating system 208.

Figure 7:
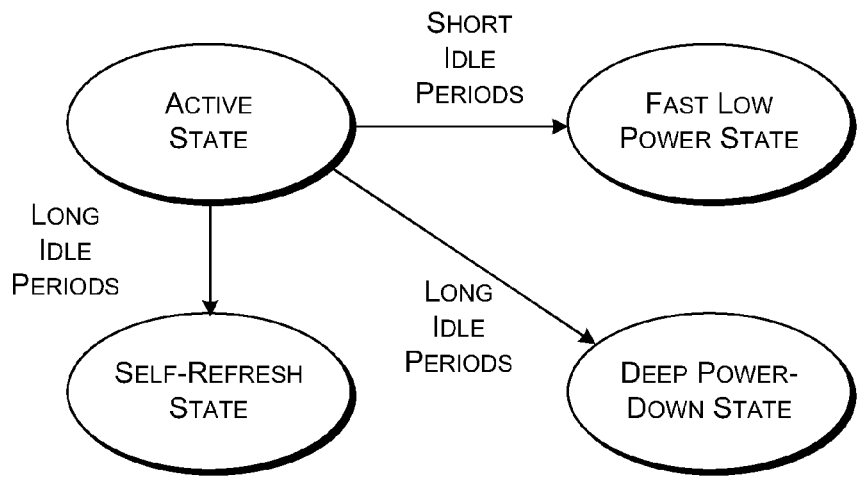
FIG. 7 shows different power states provided by an illustrative system; in this example, the PMF can be invoked when the system enters a self-refresh state.

FIG. 7 shows one environment in which the PMF 200 can be invoked. In this case, the PMF 200 is implemented by a device having four power states. An active state corresponds to a state in which the device is fully powered and actively providing service to the user. A fast low power state is invoked when the device has been idle for a short period of time; this state consumes less power than the active state. A self-refresh state is invoked when the device has been idle for a longer period of time; this state also consumes less power than the active state. A deep power-down state is invoked to essentially turn the device off.

In one implementation, the PMF 200 invokes its functionality when a command is received to enter the self-refresh state. In this example, the operating system 208 conveys instructions to the hardware-level resources 106 prior to entering the self-refresh state. At this time, the hardware-level resources 106 autonomously refresh the memory units at different rates to favor the type-A data over the type-B data.

The PMFs (100, 200) described above can be applied to any type of system, device or component. In one example, the PMFs (100, 200) can be applied to a mobile device of any type, such a mobile telephone, a personal data assistant device, a laptop computer, and so on. In another example, the PMFs (100, 200) can be applied to a collection of computing units (e.g., servers), such as provided by a data center or the like.

B. Illustrative Processes

Figure 8:
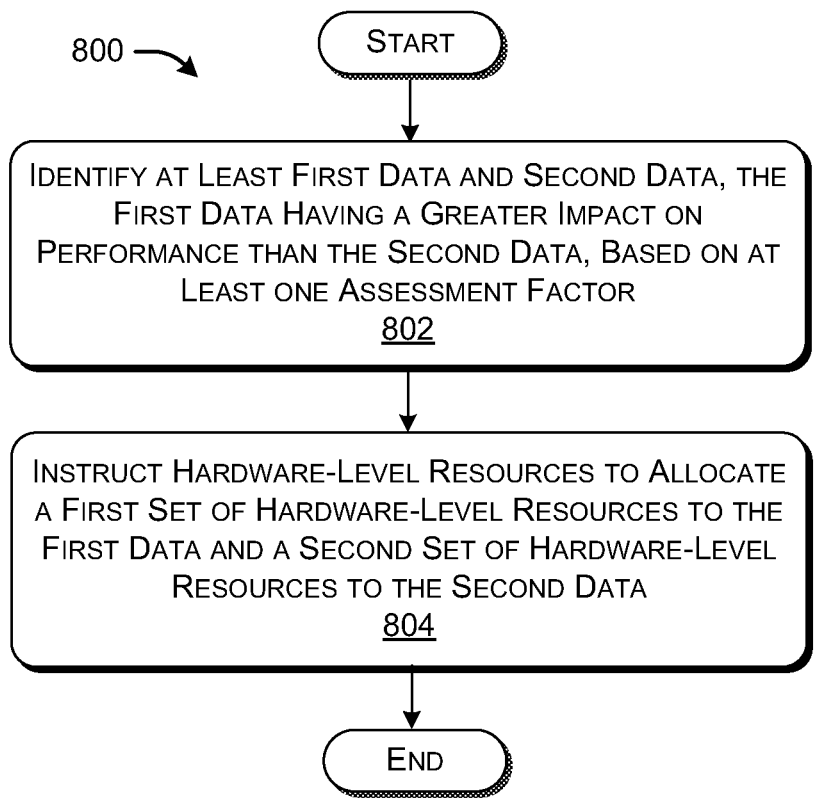
FIG. 8 is an illustrative procedure which presents an overview of one manner of operation of the PMF of FIG. 1.
Figure 9:
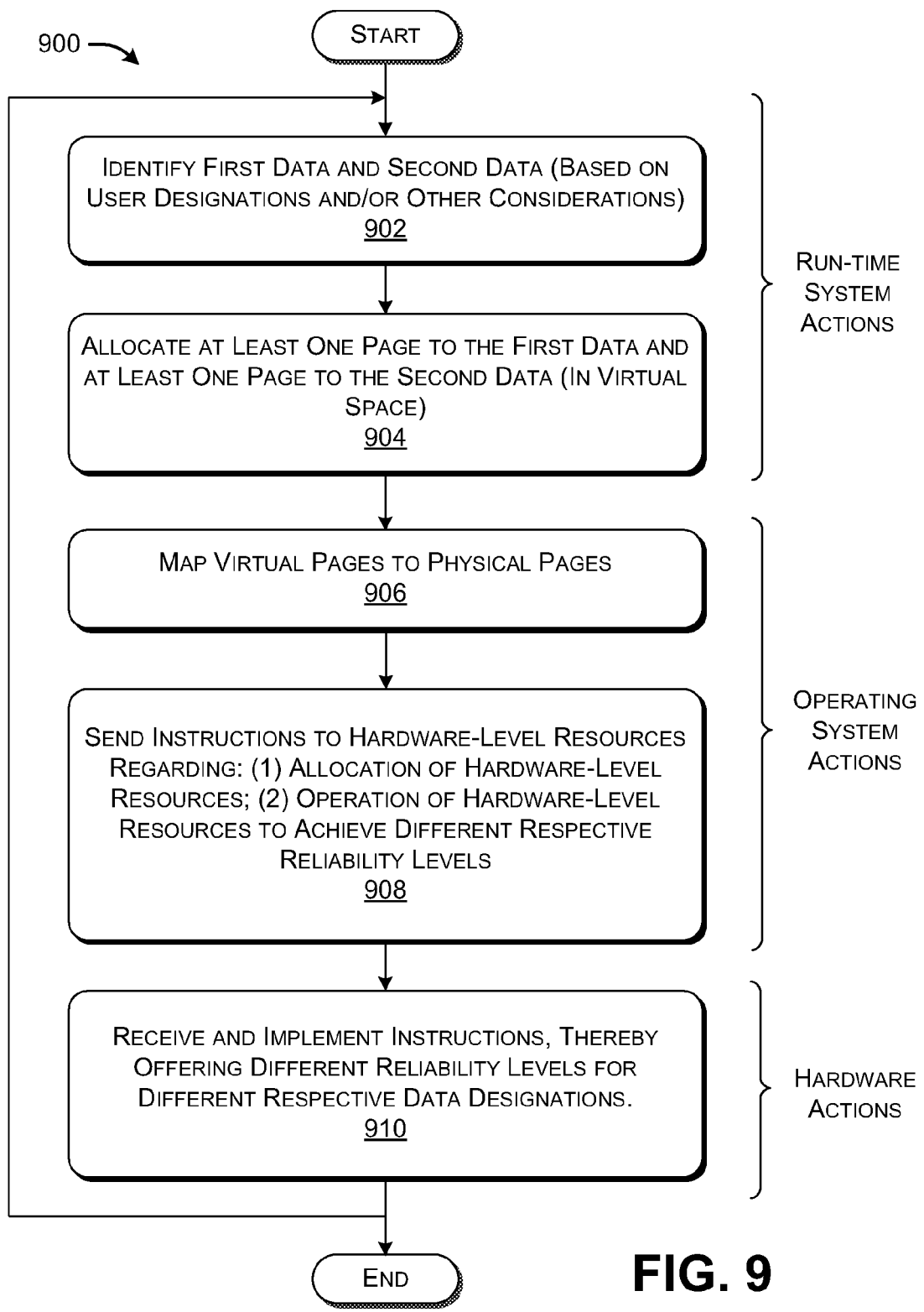
FIG. 9 shows an illustrative procedure which presents an overview of one manner of operation of the PMF of FIG. 2.

FIGS. 8 and 9 show procedures (800, 900) for explaining the operation of the PMFs (100, 200) of Section A. Since the principles underlying the operation of the PMFs (100, 200) have already been described in Section A, certain operations will be addressed in summary fashion in this section.

Starting with FIG. 8, this procedure 800 presents an overview of one manner of operation of the PMF 100 of FIG. 1.

In block 802, the software-level resources 104 identify at least first data (type-A data) and second data (type-B data). The type A data has a greater impact on the performance of the application compared to the type-B data, as assessed based on at least one assessment factor. Other implementations can identify more than two types of data.

In block 804, the software-level resources 104 instruct the hardware-level resources 106 to allocate a first set 112 of hardware-level resources to handle the type-A data and a second set 114 of hardware-level resources to handle the type-B data.

FIG. 9 shows a procedure 900 that presents an overview of one manner of operation of the PMF 200 of FIG. 2. The PMF 200 of FIG. 2 is one way (among other possible ways) to implement the general PMF strategy of FIG. 1.

In block 902, the run-time system 204 identifies type-A data and type-B data based on express designations in the application code 102 and/or other considerations (such as general rules).

In block 904, the run-time system 204 allocates at least one page to the type-A data and at least one page to the type-B data. These pages are defined with respect to virtual address space.

In block 906, the operating system 208 maps the virtual pages to physical pages. The operating system 208 can discriminate between type-A and type-B pages based on a telltale bit asserted for the type-A pages, or based on any other marking protocol.

In block 908, the operating system 208 sends instructions to the hardware-level resources 106. These instructions may instruct the hardware-level resources 106 to allocate memory units to store the type-A data and type-B data. These instructions may also set up the hardware-level resources to operate at different respective levels of reliability.

In block 910, the hardware-level resources 106 receive and carry out the instructions of the operating system 208, thereby establishing different sets of resources that exhibit different error-related performances.

The operations in procedure 900 can be performed at different stages in the execution of an application. For example, upon loading the application, the operations in the procedure 900 are invoked for at least code information, global information, etc. This is because the run-time system 204 immediately allocates memory for this information upon loading the application. The operation in procedure 900 can be performed in the course of running the application for heap information, etc., e.g., in response to malloc( ) instructions or the like.

C. Representative Processing Functionality

FIG. 10 sets forth illustrative electrical computing functionality 1000 that can be used to implement any aspect of the functions described above. With reference to FIGS. 1 and 2, for instance, the type of computing functionality 1000 shown in FIG. 10 can be used to implement any aspect of the PMFs (100, 200). In one case, the computing functionality 1000 may correspond to any type of computing device (or combination of computing devices) that includes one or more processing devices. As mentioned, in one case, the computing device can correspond to a mobile device of any type.

The computing functionality 1000 can include volatile and non-volatile memory, such as RAM 1002 (e.g., DRAM memory as described above) and ROM 1004, as well as one or more processing devices 1006. The computing functionality 1000 also optionally includes various media devices 1008, such as a hard disk module, an optical disk module, and so forth. The computing functionality 1000 can perform various operations identified above when the processing device(s) 1006 executes instructions that are maintained by memory (e.g., RAM 1002, ROM 1004, or elsewhere). More generally, instructions and other information can be stored on any computer readable medium 1010, including, but not limited to, static memory storage devices, magnetic storage devices, optical storage devices, and so on. The term computer readable medium also encompasses plural storage devices.

The computing functionality 1000 also includes an input/output module 1012 for receiving various inputs from a user (via input modules 1014), and for providing various outputs to the user (via output modules). One particular output mechanism may include a presentation module 1016 and an associated graphical user interface (GUI) 1018. The computing functionality 1000 can also include one or more network interfaces 1020 for exchanging data with other devices via one or more communication conduits 1022. One or more communication buses 1024 communicatively couple the above-described components together.

In closing, the description may have described various concepts in the context of illustrative challenges or problems. This manner of explication does not constitute an admission that others have appreciated and/or articulated the challenges or problems in the manner specified herein.

More generally, although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method, implemented by computing functionality, for executing an application, the method comprising:
    identifying at least first data and second data associated with the application, corruption of the first data having a first impact on a performance of the application, and corruption of the second data having a second impact on the performance of the application, the first impact being assessed as less preferable than the second impact based on at least one assessment factor;
    allocating virtual pages of memory to the first data and the second data;
    using an operating system page table to map the virtual pages of memory to physical pages of memory storing the first data and the second data,
    wherein the operating system page table maps a first virtual page of memory to a first physical page of memory storing the first data and a second virtual page of memory to a second physical page of memory storing the second data; and
    instructing at least one memory unit to refresh the first physical page of memory storing the first data at a first rate and to refresh the second physical page or memory storing the second data at a second rate.

2. The method of claim 1, wherein said instructing achieves at least one performance objective relating to conservation of energy.

3. The method of claim 1, wherein the at least one memory unit includes a first memory unit storing the first physical page and a second memory unit storing the second physical page.

4. The method of claim 1, wherein the at least one memory unit comprises a DRAM memory device having a first partition storing the first physical page and a second partition storing the second physical page.

5. The method of claim 1, wherein said identifying comprises receiving designations provided in application code associated with the application, the designations identifying at least one of the first data and the second data.

6. The method of claim 1, wherein said at least one assessment factor is based on an assessment made by a user.

7. The method of claim 1, wherein the first physical page refreshes at a cycle time of approximately 32 milliseconds.

8. The method of claim 1, where the second physical page refreshes at a cycle time of approximately one second.

9. The method of claim 1, wherein both the first rate and the second rate are non-zero.

10. The method of claim 1, wherein the computing functionality is provided by a mobile device, and wherein said instructing is invoked when the mobile device enters a low power mode of operation.

11. The method of claim 1, wherein the computing functionality is provided by a server in a data center.

12. Functionality for achieving a performance objective, the functionality comprising:
    software-level resources; and
    hardware-level resources,
    wherein the software-level resources, in conjunction with the hardware-level resources, implement an application;
    the hardware-level resources comprising:
        a first set of memory resources dynamically designated to refresh at a first non-zero rate for handling first data associated with the application; and
        a second set of memory resources dynamically designated to refresh at a second non-zero rate for handling second data associated with the application,
    corruption of the first data having a greater impact on a performance of the application than corruption of the second data, and
    the first set of memory resources refreshing at the first non-zero rate having a higher reliability compared to the second set of memory resources refreshing at the second non-zero rate,
    the software-level resources comprising an operating system configured to use a page table to map a first virtual page of memory storing the first data to a first physical page of memory on the first set of memory resources and to map a second virtual page of memory storing the second data to a second physical page of memory on the second set of memory resources.

13. The functionality of claim 12, embodied as a mobile device.

14. The functionality of claim 12, embodied as a server in a data center.

15. The functionality of claim 12, wherein the first set of memory resources comprises a first dynamic random-access memory device and the second set of memory resources comprises a second dynamic random-access memory device.

16. A mobile device comprising:
    memory configured to provide different refresh rates for physical pages of memory;
    a processing device; and
    instructions which, when executed by the processing device, cause the processing device to:
    allocate a first virtual page of memory to first data and a second virtual page of memory to second data, the first data and the second data having different associated impacts when corrupted;
    use an operating system page table to map the first virtual page of memory to a first physical page of memory and to map the second virtual page of memory to a second physical page of memory;
    cause the first physical page of memory to store the first data;
    cause the second physical page of memory to store the second data;
    instruct the memory to periodically refresh the first physical page of memory storing the first data at a first refresh rate; and
    instruct the memory to periodically refresh the second physical page of memory at a second refresh rate that is lower than the first refresh rate.

17. The mobile device of claim 16, wherein the instructions, when executed by the processing device, cause the processing device to:
 allocate heap memory for data storage on the memory;
 partition the heap memory into a first heap portion having the first data and a second heap portion having the second data; and
 designate the first heap portion to be refreshed at the first refresh rate and the second heap portion to be refreshed at the second refresh rate.

18. The mobile device of claim 17, wherein the instructions, when executed by the processing device, cause the processing device to:
 allocate the first heap portion responsive to a first call to a first dynamic memory allocation function; and
 allocate the second heap portion responsive to a second call to a second dynamic memory allocation function that is different than the first dynamic memory allocation function.

19. The mobile device of claim 16, wherein the instructions, when executed by the processing device, cause the processing device to:
 load the first data and the second data as global data upon initial loading of an application that defines the first data and the second data as global and annotates the first data and the second data to have different refresh rates.

* * * * *